United States Patent
Huang et al.

(10) Patent No.: US 9,245,078 B2
(45) Date of Patent: *Jan. 26, 2016

(54) INTEGRATED CIRCUIT DESIGN SYSTEM

(71) Applicant: TAIWAN SEMICONDUCTOR MANUFACTURING COMPANY, LTD., Hsinchu (TW)

(72) Inventors: Mu-Jen Huang, Taipei (TW); Yu-Sian Jiang, Kaohsiung (TW); Chien-Wen Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/310,444

(22) Filed: Jun. 20, 2014

(65) Prior Publication Data
US 2014/0304673 A1    Oct. 9, 2014

Related U.S. Application Data

(62) Division of application No. 13/601,773, filed on Aug. 31, 2012, now Pat. No. 8,775,993.

(51) Int. Cl.
*G06F 17/50* (2006.01)

(52) U.S. Cl.
CPC ........ *G06F 17/5072* (2013.01); *G06F 17/5081* (2013.01); *G06F 17/5009* (2013.01)

(58) Field of Classification Search
CPC ............ G06F 17/5081; G06F 17/5009; G06F 17/5072
USPC ......... 716/11, 106, 132, 136, 51, 54, 55, 122, 716/130, 131; 703/15
See application file for complete search history.

(56) References Cited

U.S. PATENT DOCUMENTS

| 5,987,086 A | 11/1999 | Raman et al. |
| 6,006,024 A | 12/1999 | Guruswamy et al. |
| 6,449,761 B1 | 9/2002 | Greidinger et al. |

(Continued)

FOREIGN PATENT DOCUMENTS

JP   2010113723   5/2010

OTHER PUBLICATIONS

Xue, Jiying et al., "Layout-Dependent STI Stress Analysis and Stress-Aware RF/Analog Circuit Design Optimization", ICCAD-09, Nov. 2-5, 2009, San Jose, California, pp. 521-528.

(Continued)

*Primary Examiner* — Phallaka Kik
(74) *Attorney, Agent, or Firm* — Hauptman Ham, LLP

(57) ABSTRACT

A design system for designing an integrated circuit, and the design system includes a processor and a computer readable medium embodying computer program code. The computer program code includes instructions executable by the processor and configured to cause the processor to: modify a circuit design of the integrated circuit to compensate for an impact of layout parameters of the circuit design; generate at least one recommended layout parameter of an integrated circuit device within the integrated circuit; calculate a circuit performance parameter of the integrated circuit using the at least one recommended layout parameter; and generate a layout design of the modified circuit design of the integrated circuit according to the at least one recommended layout parameter.

20 Claims, 7 Drawing Sheets

(56) References Cited

U.S. PATENT DOCUMENTS

| | | | |
|---|---|---|---|
| 6,578,183 B2 | 6/2003 | Cheong et al. | |
| 6,988,253 B1 | 1/2006 | Lipton et al. | |
| 7,080,349 B1 | 7/2006 | Babcock et al. | |
| 7,197,734 B1 | 3/2007 | Singh et al. | |
| 7,404,168 B2 | 7/2008 | Miller et al. | |
| 7,840,917 B2* | 11/2010 | Bae et al. | 716/102 |
| 7,954,072 B2 | 5/2011 | Liu et al. | |
| 8,024,674 B2* | 9/2011 | Arimoto | 716/51 |
| 8,176,445 B1 | 5/2012 | Qian | |
| 8,286,109 B1 | 10/2012 | So et al. | |
| 8,510,689 B1 | 8/2013 | White | |
| 8,621,409 B2 | 12/2013 | Lee et al. | |
| 8,627,253 B2* | 1/2014 | Yeh et al. | 716/115 |
| 8,745,554 B2* | 6/2014 | Cheng et al. | 716/55 |
| 8,775,993 B2* | 7/2014 | Huang et al. | 716/112 |
| 2003/0131334 A1* | 7/2003 | Suaya et al. | 716/12 |
| 2004/0068712 A1* | 4/2004 | Heng et al. | 716/21 |
| 2004/0089881 A1* | 5/2004 | Ono | 257/208 |
| 2004/0243964 A1 | 12/2004 | McElvain et al. | |
| 2005/0210422 A1 | 9/2005 | Galatenko et al. | |
| 2006/0107246 A1 | 5/2006 | Nakamura | |
| 2007/0094622 A1 | 4/2007 | Lee et al. | |
| 2007/0118824 A1* | 5/2007 | Bae et al. | 716/5 |
| 2007/0264731 A1* | 11/2007 | Jeng | 438/14 |
| 2007/0265725 A1* | 11/2007 | Liu et al. | 700/121 |
| 2007/0266352 A1* | 11/2007 | Cheng et al. | 716/4 |
| 2007/0283307 A1 | 12/2007 | Arizono | |
| 2008/0127017 A1 | 5/2008 | Alpert et al. | |
| 2008/0127020 A1 | 5/2008 | Rittman | |
| 2008/0163150 A1* | 7/2008 | White et al. | 716/12 |
| 2008/0184183 A1* | 7/2008 | Kobayashi | 716/9 |
| 2008/0250361 A1 | 10/2008 | Bae et al. | |
| 2009/0144686 A1* | 6/2009 | Lensing et al. | 716/10 |
| 2009/0249263 A1 | 10/2009 | Arimoto | |
| 2010/0188705 A1* | 7/2010 | Giannetti et al. | 358/1.18 |
| 2010/0218156 A1 | 8/2010 | Pierrat | |
| 2010/0223585 A1 | 9/2010 | Chern | |
| 2011/0082680 A1 | 4/2011 | Chang et al. | |
| 2011/0143271 A1 | 6/2011 | Koshiba et al. | |
| 2011/0161907 A1 | 6/2011 | Cheng et al. | |
| 2011/0231804 A1* | 9/2011 | Liu et al. | 716/54 |
| 2012/0053923 A1 | 3/2012 | Li et al. | |
| 2012/0227024 A1 | 9/2012 | Uppaluri et al. | |
| 2012/0254818 A1 | 10/2012 | Liu et al. | |
| 2012/0266124 A1 | 10/2012 | Alpert et al. | |
| 2012/0278781 A1 | 11/2012 | Wann et al. | |
| 2012/0304138 A1 | 11/2012 | Farooq et al. | |
| 2012/0304139 A1 | 11/2012 | Chen et al. | |
| 2012/0304146 A1 | 11/2012 | Jiang et al. | |
| 2013/0091483 A1* | 4/2013 | Chen et al. | 716/134 |
| 2013/0198703 A1 | 8/2013 | Lu et al. | |
| 2013/0205272 A1 | 8/2013 | Kim et al. | |
| 2013/0212548 A1* | 8/2013 | Muddu et al. | 716/112 |
| 2013/0239077 A1 | 9/2013 | Wang et al. | |
| 2013/0246980 A1 | 9/2013 | Takekawa | |
| 2013/0290916 A1 | 10/2013 | Lee et al. | |
| 2013/0326438 A1 | 12/2013 | Lee et al. | |
| 2013/0326447 A1 | 12/2013 | Huang et al. | |
| 2014/0007031 A1* | 1/2014 | Huang et al. | 716/112 |

OTHER PUBLICATIONS

Daglio et al., "Building the Hierarchy from a Flat Netlist for a Fast and Accurate Post-Layout Simulation with Parasitic Components", IEEE Proceedings of the Design, Automation and Test in Europe Conference and Exhibition Designers' Forum, 2004, 2 pages.

Gu et al., "Algorithm and Architecture for a High Density, Low Power Scalar Product Macrocell", IEE Proceedings on Comput. Digit. Tech., vol. 151, No. 2, Mar. 2004, pp. 161-172.

\* cited by examiner

INTEGRATED CIRCUIT DESIGN SYSTEM

PRIORITY CLAIM

The present application is a divisional of U.S. application Ser. No. 13/601,773, filed Aug. 31, 2012, which is incorporated herein by reference in its entirety.

BACKGROUND

In an integrated circuit design process, a circuit schematic of an integrated circuit being designed is generated first, for example, in a schematic editor. A pre-layout simulation is performed on the circuit schematic to simulate a performance of the integrated circuit. Since the layout of the integrated circuit has not yet been created at the time the pre-layout simulation is performed, layout-dependent effects (LDEs) of the layout of the integrated circuit cannot be taken into account in the pre-layout simulation. Instead, in the pre-layout simulation, default values of the LDEs are assumed.

Following the pre-layout simulation, the layout of the integrated circuit is generated, for example, using a layout editor. A design verification is then performed on the layout, wherein the design verification includes an LDE parameter extraction, for example.

A post-layout simulation is then performed on the layout. In the post-layout simulation, the LDEs are taken into account, so that the generated circuit performance parameters reflect the actual circuit more accurately. The circuit performance parameters are then compared to the design specification. If the circuit performance parameters meet the requirement of the design specification, the design can be approved. Otherwise, the design process loops back to the schematic generation and editing steps, and the steps including the pre-layout simulation, the layout creation, the design verification, and the post-layout simulation are repeated to modify the design. The loop is repeated until the circuit performance parameters meet the requirement of the design specification.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and not intended to limit the scope of the disclosure.

The layout system in accordance with an embodiment enables a look ahead layout-dependent effects (LDE) analysis to reduce the number of iterations performed during the layout design process by prediction and predetermination of LDE parameters during the design of the layout according to design specifications and enables verification of accuracy of the electrical design of the layout.

Figure 1:
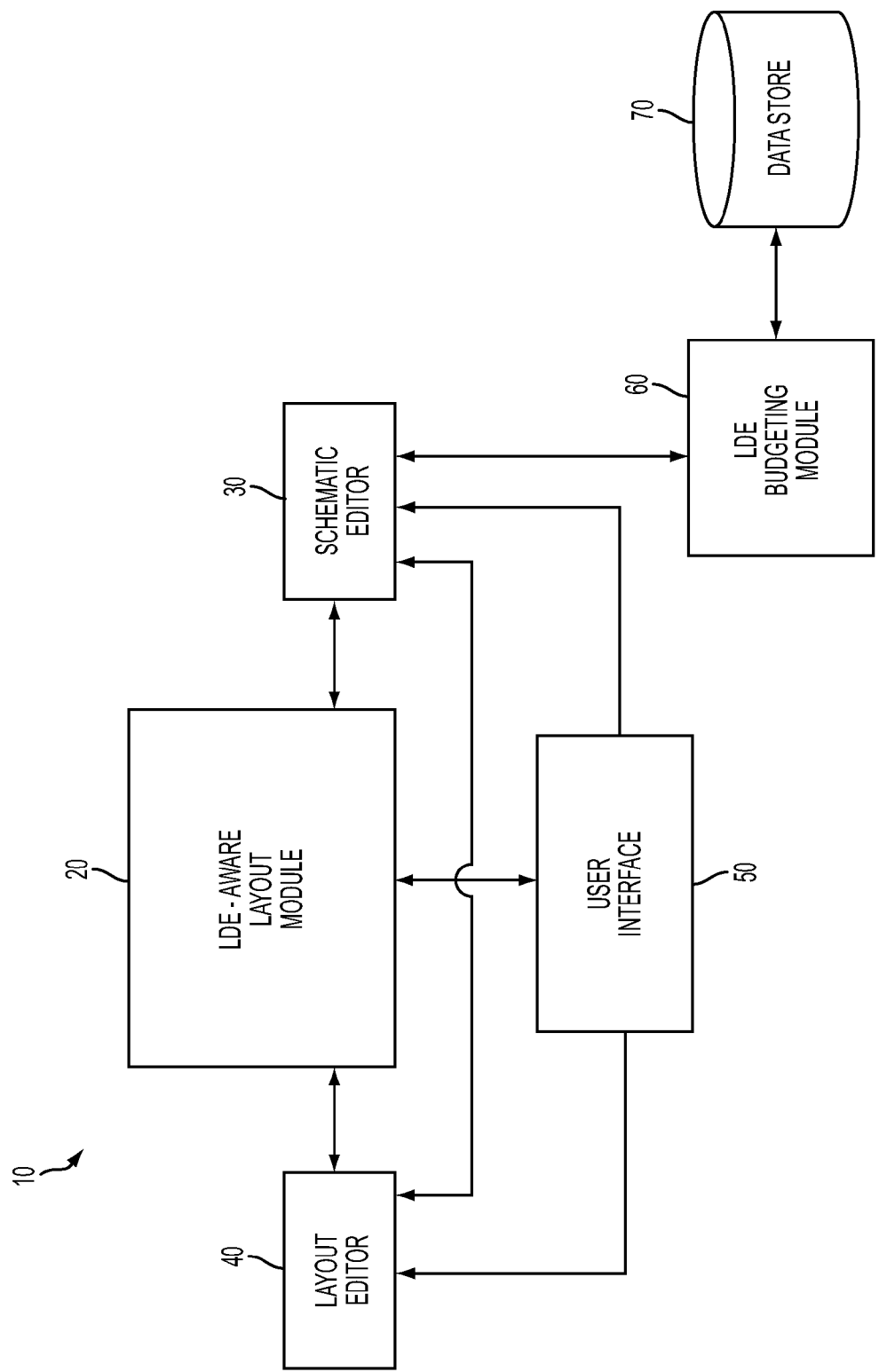
FIG. 1 is a block diagram of a layout-dependent effect (LDE) aware layout design system in accordance with one or more embodiments.

FIG. 1 illustrates a block diagram of an LDE-aware layout design system 10 for designing the layout of integrated circuits in accordance with one or more embodiments.

Layout design system 10 includes LDE-aware layout module 20, schematic editor 30, layout editor 40, a user interface 50, an LDE budgeting module 60, and an LDE constraints data store 70. In one or more embodiments, LDE-aware layout module 20, schematic editor 30, layout editor 40 and LDE-budgeting module 60 are sets of executable instructions.

Schematic editor 30 is configured to be used to generate and edit circuit schematics of integrated circuits that are being designed. Schematic editor 30 is also configured to generate a pre-simulation of the circuit schematics. According to one or more embodiments, schematic editor 30 includes a set of executable instructions for generating the pre-simulation of the schematic. In other embodiments, a separate device (e.g., a simulator) in communication with the schematic editor 30 is used to generate the pre-simulation of the schematic. Layout editor 40 is configured to be used to generate and edit layouts of the integrated circuits in accordance with the circuit schematics generated by the schematic editor 30. LDE-aware layout module 20 is configured to extract layout parameters (LDE parameters) from the layout generated by layout editor 40 and calculate circuit performance parameters related to circuit performance of the circuit via computing device 700 (depicted in FIG. 7).

User interface 50 is configured to receive and display the circuit schematic from schematic editor 30, the layout from layout editor 40, and the LDE parameters extracted from the layout and calculated circuit performance parameters via LDE-aware layout module 20. User interface 50 is also configured to receive user inputs to adjust the circuit schematics and the layout and to select specific devices in order to display circuit performance parameters of specific devices selected by a user.

LDE budgeting module 60 is configured to generate layout constraints according to electrical specifications and potential degradation and area tolerance of the selected devices. The generated layout constraints are stored in and retrieved from the constraints data store 70. Upon request, the constraints are sent to the LDE-aware layout module 20 via the schematic editor 30 and are used to modify the LDE parameters (e.g., to optimize the LDE parameters). The communication between components 20 through 70 are schematically illustrated by arrows in FIG. 1.

An integrated circuit includes a plurality of devices, and the layout design system 10 enables design and layout optimization at a device level (i.e., one or more devices) within the integrated circuit according to one or more embodiments.

Figure 2A:
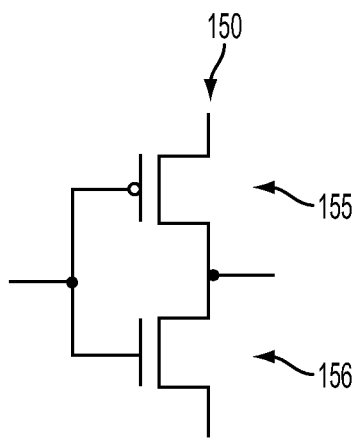
FIG. 2A is a schematic of an integrated circuit to be designed using the system of FIG. 1 in accordance with one or more embodiments.
Figure 3:
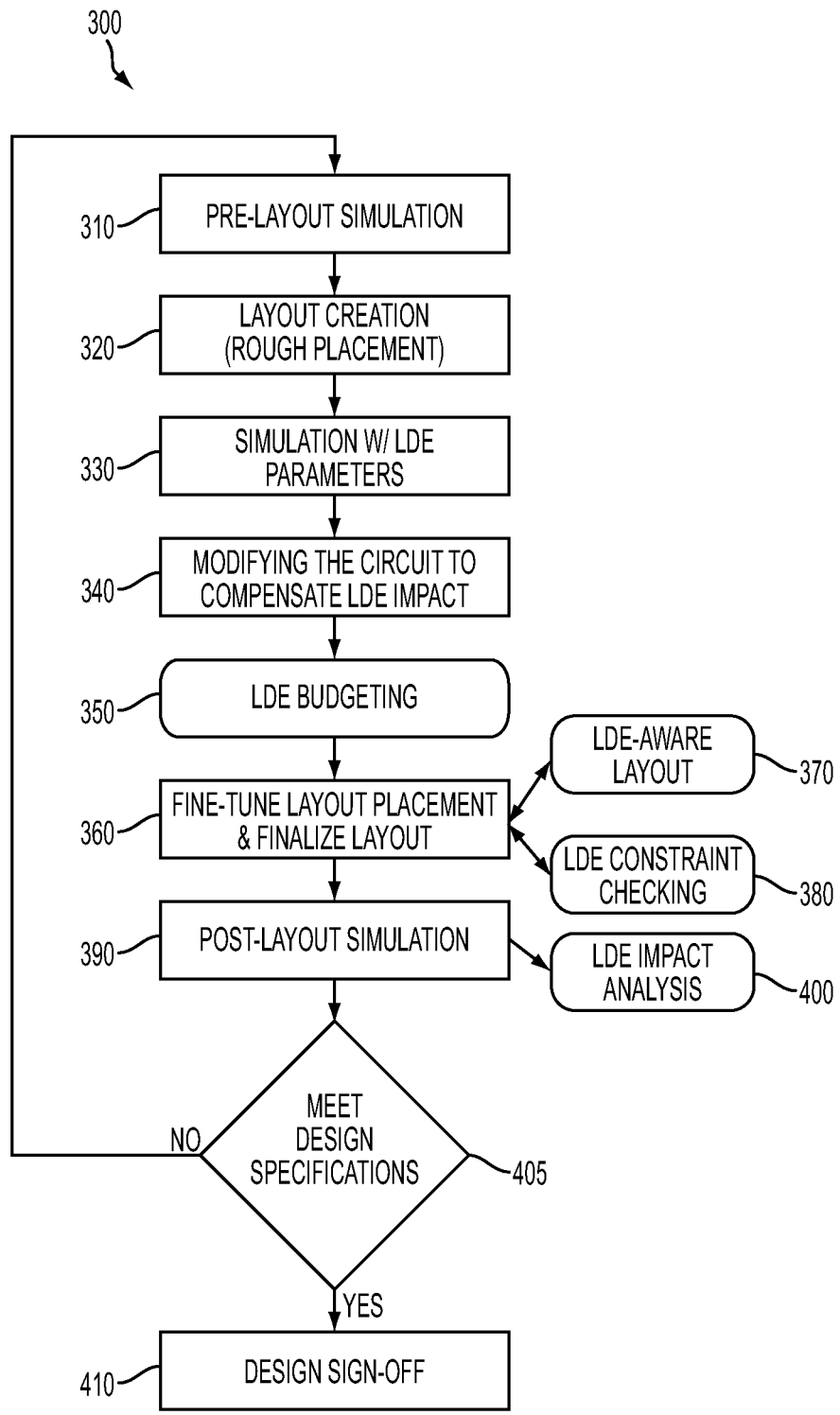
FIG. 3 is a flow chart of an LDE-aware circuit layout design method in accordance with one or more embodiments.

FIG. 2A is a schematic view of an exemplary integrated circuit 150 to be designed by the method 300 shown in FIG. 3 in accordance with one or more embodiments. The circuit 150 is an inverter including a PMOS transistor 155 and an NMOS transistor 156 having both drains and gates thereof interconnected. Other circuits to be designed are within the scope of various embodiments.

Figure 2B:
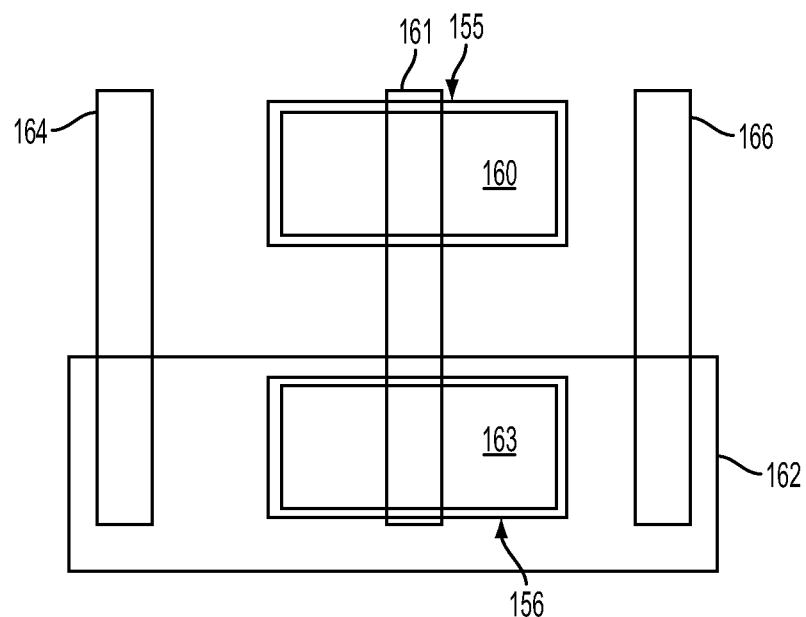
FIG. 2B is a schematic of a layout of the circuit of FIG. 2A in accordance with one or more embodiments.

FIG. 2B is a schematic of a layout of the circuit of FIG. 2A, in accordance with one or more embodiments. In the layout, PMOS transistor 155 includes an active region 160 and a gate 161 formed over the active region 160. NMOS transistor 156 is formed within a p-well region 162 and includes an active region 163 and the gate 161 formed over the active region 163. Dummy gate electrodes 164 and 166 are formed adjacent to the transistors 155 and 156.

FIG. 3 is a flow chart of an LDE-aware circuit layout design method 300 within one or more embodiments.

In operation 310, a pre-layout simulation of the circuit 150 to be designed is generated. The pre-layout simulation is performed via schematic editor 30. From operation 310, the process continues to operation 320 where a layout (e.g., as shown in FIG. 2B) of the circuit design is created via the layout editor 40 based on the pre-layout simulation generated in operation 310. Individual devices (e.g., transistors 155 and 156) of the circuit 150 are placed in desired locations via the layout editor 40, and design layout constraints are checked by the layout editor 40, to prevent violation of design rules.

From operation 320, the process continues to operation 330, where a simulation is generated via the schematic editor 30 or separate device (e.g., a simulator) with LDE parameters being taken into consideration. The LDE parameters include, and are not limited to, the parameters related to well proximity effect (WPD), OD-spacing effect (OSE), poly-spacing effect (PSE), length of diffusion (LOD) effect, and boundary effect, etc. From operation 330, the process continues to operation 340 where, the method includes modifying the circuit based on the simulation created in operation 330, to thereby compensate for LDE impact. For example, if the circuit performance does not meet the circuit specification due to the LDE impact, the geometry of the devices within the circuit is enlarged to compensate for potential degradation. In one or more embodiments, if necessary, the circuit topology is modified and the process is repeated beginning at operation 310.

Next, in operation 350, LDE budgeting is performed via the LDE budgeting module 60 to enter constraints, tolerated device degradation (e.g., for transistors 155 and 156), area constraints for the devices of the circuit 150 and other parameters associated with the circuit 150 being designed. The LDE parameters are modified based on the design constraints for optimum performance of the circuit 150. Details regarding the LDE budgeting operation will be discussed below with reference to FIGS. 4 and 5.

From operation 350, the process continues to operation 360 where layout placement is fine-tuned and the layout is finalized. In operation 360, routing is performed to layout metal lines used for interconnecting the devices (e.g., transistors 155 and 156) in the circuit 150. The layout is finalized (i.e., completed) by creating an LDE-aware layout (operation 370) and by checking LDE constraints (operation 380). According to one or more embodiments, operations 370 and 380 are performed independently from each other.

In operation 370, the LDE-aware layout is created by first extracting LDE parameters determined via the LDE budgeting module 60, and then determining circuit performance parameters via LDE-aware layout module 20 (as depicted in FIG. 1) using the extracted LDE parameters. LDE-aware layout module 20 determines circuit performance parameters, e.g., drive currents, threshold voltage, transconductance, and the like, corresponding to the devices (e.g., transistors 155 and 156) within the layout. According to an embodiment, the extraction of LDE parameters and determination of circuit performance parameters are performed by the computing device 700, and are performed simultaneously with the layout creation without waiting for the layout of the entire circuit 150 to be completed. The circuit performance parameters are viewable by the user via the user interface 50.

Additional details regarding performance of pre-layout simulation, layout creation and simulation with LDE parameter consideration, and creating an LDE-aware layout in corresponding operations 310, 320, 330 and 370, can be found in co-pending application Ser. No. 13/115,752 filed on May 25, 2011, entitled "On-the-Fly Device Characterization from Layouts of Circuits", the entire contents of which are incorporated by reference herein.

After creating the LDE-aware layout in operation 370, the process returns to operation 360.

From operation 360, the process then continues to operation 380 where an LDE-constraints checking process is performed to confirm that design constraints have not been violated when the LDE impacts are considered. Additional details regarding operation 380 will be discussed with reference to FIG. 6.

After the completion of operation 380, the process returns to operation 360 and the layout is finalized. From operation 360, the process then continues to operation 390.

In operation 390, a post-layout simulation is generated via schematic editor 30 and then a layout is generated via layout editor 40 based on final evaluation results.

At operation 400, an interactive LDE impact analysis is performed where an analysis of the circuit performance parameters for the devices are analyzed by the user via the user interface 50, using a predetermined algorithm and/or set of instructions stored within the LDE budgeting module 60. According to one or more embodiments, operation 400 is performed as a part of the post-layout simulation performed in operation 390. Further, according to other embodiments, operation 400 is performed as a separate analysis tool. The analysis includes changes in the circuit performance parameters based on the set design constraints as set by the user and LDE-parameter recommendations determined by the LDE budgeting module 60. The analysis is performed on the final layout and includes comparison data between the set design constraints and recommendations. In addition, the analysis includes an overall analysis of the cost and degradation reduction of the devices, for example. The analysis further includes statistical data of the LDE degradation of each device in various different formats (e.g., in a histogram).

After the post-layout simulation is performed at operation 390, the circuit performance parameters of the entire circuit 150 are generated using the LDE-aware layout module 20, and are compared to the requirements of the design specification using the LDE budgeting module 60. From operation 390, the process continues to operation 405 where it is determined whether the circuit parameters meet the requirements of the design specifications. In one or more embodiments, the method loops back to step 310 to modify the layout design if the circuit performance parameters do not meet the requirements of the design specifications. Otherwise, if circuit performance parameters meet the requirements of the design specifications, the circuit 150 and the layout thereof are approved at operation 410 via the user using the layout editor 40, and the user determines the design is complete. At this stage of the method, the user can begin preparation work for chip implementation e.g., design kits implementation, based on the completion of the layout design and the chip is then implemented.

Figure 4:
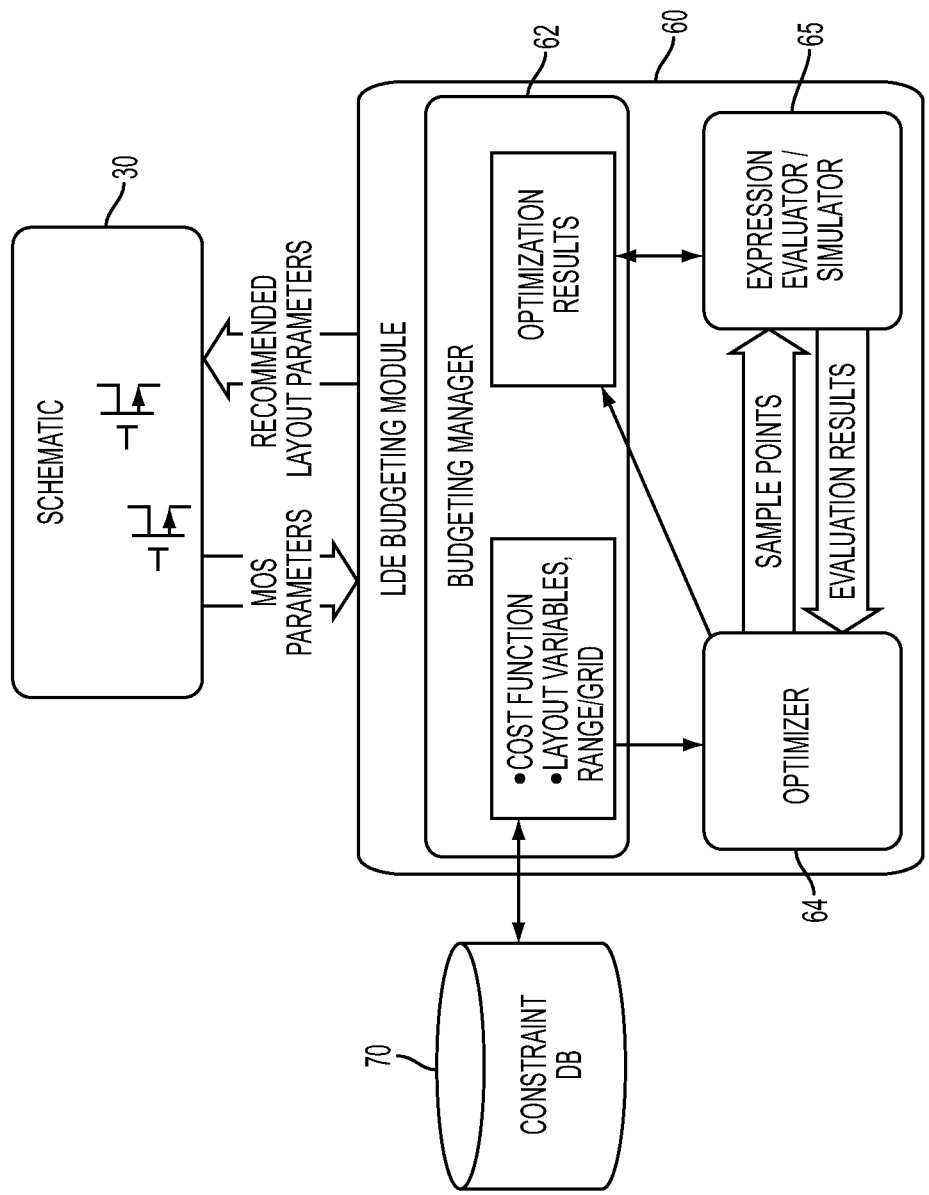
FIG. 4 is a block diagram of the LDE Budgeting module of the system of FIG. 1 in accordance with one or more embodiments.

FIG. 4 is a detailed block diagram of LDE budgeting module 60 of the system of FIG. 1.

Figure 5:
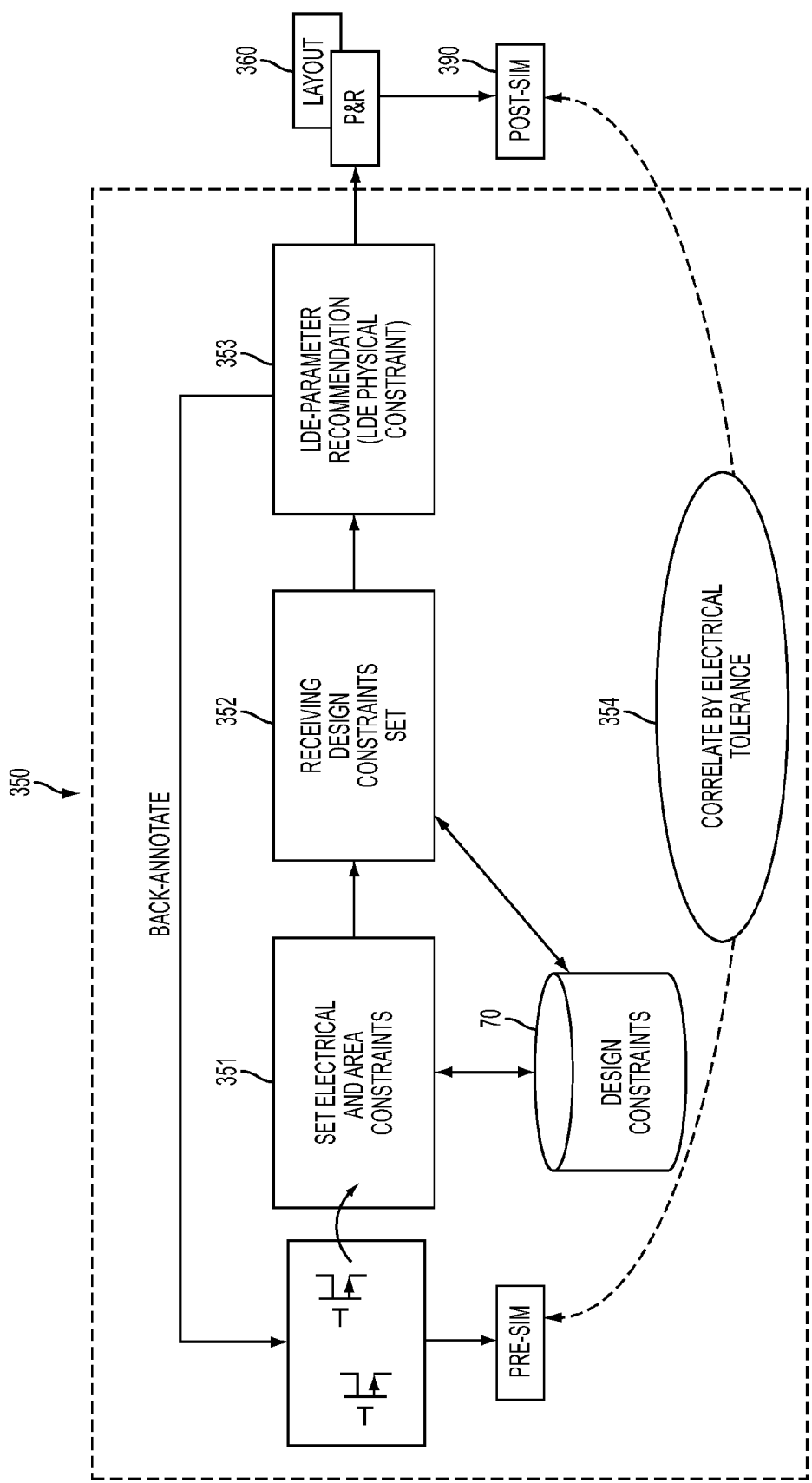
FIG. 5 is a flow chart of the LDE Budgeting operation of the method of FIG. 3 in accordance with one or more embodiments.

As shown in FIG. 4, the LDE budgeting module 60 is in data communication with the schematic editor 30. The LDE budgeting module 60 comprises a budgeting manager 62, an optimizer 64 and an expression evaluator/simulator 65. According to one or more embodiments, LDE budgeting module 60 is separate from the schematic editor 30. According to other embodiments, LDE budgeting module 60 is integrated (i.e., included) within schematic editor 30. Details regarding the operation of the LDE budgeting module 60 will be discussed below with reference to FIG. 5. Effectively, FIG. 5 is a flow chart of LDE budgeting operation 350 of the method of FIG. 3 in accordance with one or more embodiments.

LDE budgeting module 60 receives circuit performance parameters corresponding to selected devices (e.g., transistors 155 and 156) of the layout from schematic editor 30. The process of performing LDE budgeting (operation 350 shown in FIG. 3), begins at operation 351 as shown in FIG. 5, where the user views circuit 150 being designed at a display of user interface 50 and sets predetermined design constraints (e.g., electrical and area constraints) of circuit 150 through schematic editor 30. The design constraints are stored within constraints data store 70. From operation 351, the process continues to operation 352, where LDE budgeting module 60 receives the design constraints stored in data store 70 or in real-time while being set by the user. Upon receiving the design constraints, information including a cost function of the circuit 150 being designed and layout variables, for example, of the circuit performance parameters are selected from the received information via the budgeting manager 62 of the LDE budgeting module 60. According to one or more embodiments, the information also includes specific tolerance ranges including electrical tolerances. The information is processed via optimizer 64 shown in FIG. 4. Optimizer 64 modifies the LDE parameters of one or more devices (e.g., transistors 155 and 156) within the circuit 150 for optimum performance according to the design constraints, by selecting sample points from the information, and transmitting the sample points to the expression evaluator/simulator 65 for evaluation. Evaluation results determined in operation 352 are sent to the budgeting manager 62 either directly from the expression/evaluator simulator 65 or indirectly from the optimizer 64. Based upon evaluation results, the LDE budgeting module 60 determines LDE-parameter recommendations for the required LDE parameters at operation 353, and transmits the recommendations to the schematic editor 30, to predict post-layout effects of the LDE parameters (as performed in operation 360 shown in FIG. 5). A back-annotating process is performed by which the LDE parameters are back-annotated to schematic where the default LDE parameters are replaced with the extracted LDE parameters. Because the operations 351, 352, and 353 are performed and the recommended LDE parameters are back-annotated to schematic, the LDE parameters are included in the pre-simulation.

At operation 354, the results of the pre-simulation and post-simulation operations (operation 310 and operation 390 shown in FIG. 3) are then correlated since the layout is driven by the same LDE parameters. For example, by setting the electrical tolerance as an optimal constraint and performing operation 354, the pre-simulation with back-annotated LDE parameters more closely corresponds to the post-layout simulation.

Figure 6:
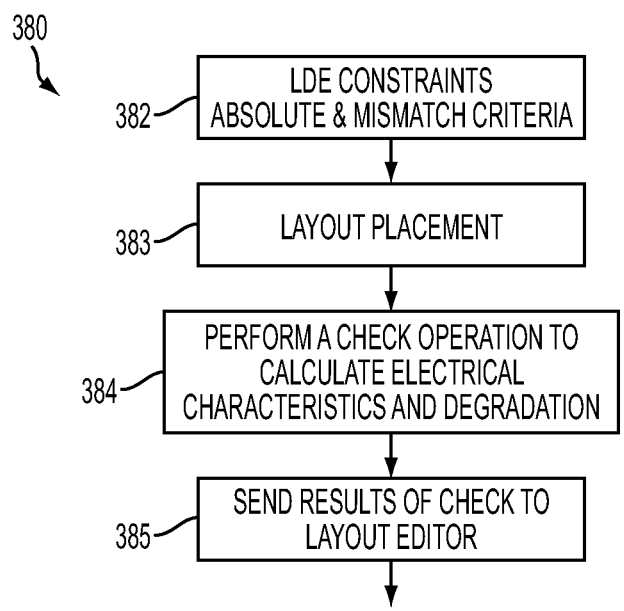
FIG. 6 is a flow chart of the LDE constraints checking operation of the method of FIG. 3 in accordance with one or more embodiments.

FIG. 6 is a flow chart of the LDE constraints checking operation 380 of the method 300 of FIG. 3 within one or more embodiments. As shown, in operation 382, design constraints are set including LDE constraints based on both absolute and mismatch criteria. The design constraints include mathematical expressions of the LDE-aware layout, relations between different devices and cost functions including area cost. Information including the cost functions, and electrical constraints (i.e., set by the user goal and based on cost functions) is retrieved from the LDE budgeting module 60. The mathematical expressions include setting absolute values for electrical parameters and circuit functions, and tolerances for electrical degradation including mismatch tolerances for matched instances, and determining a weighted priority of the design constraints.

From operation 382, the process continues to operation 383, where a layout placement is repeated based on the design constraints set in operation 382. In one or more embodiments, the layout placement performed in operation 383 is the same as that performed in operation 360. In other embodiments, LDE budgeting operation 350 is skipped, and performed independent of the layout placement operation, along with LDE-aware layout operation 370, LDE constraints checking operation 380 and LDE impact analysis operation 400 (discussed above) such that if the layout placement in operation 383 is performed by another method, these operations can be implemented to perform LDE constraint checking on the layout.

A check is then performed in operation 384, to calculate electrical characteristics of one or more of the devices of the circuit 150 and degradation thereof based on LDE impact. Further, an evaluation of the design constraints is performed using the calculations by comparing the calculations with the design constraints. Operation 384 is performed before performing routing (i.e., adding wiring interconnects to the circuit design). In one or more embodiments, operation 384 is performed after routing.

From operation 384, the process continues to operation 385 where the results of the check performed including any violations, are sent to the layout editor 40 accessible by the user via the user interface 50 in an interactive query and/or stored within an associated database for later use.

Figure 7:
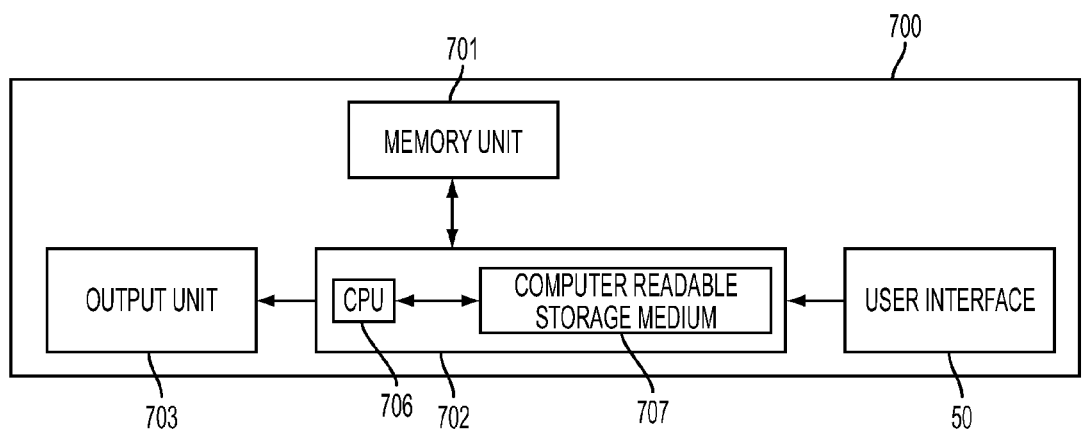
FIG. 7 is a block diagram of a general purpose computing device for implementing the design system shown in FIG. 1 in accordance with one or more embodiments.

FIG. 7 is a block diagram of a general purpose computing device 700 for implementing the design system shown in FIG. 1 in accordance with one or more embodiments.

Computing device 700 is a data or information processing device such as a CAD tool, a personal computer or a workstation. As shown, the device 700 includes a memory unit 701 for storing circuit information and other information such as design rules, control unit 702 for carrying out operations for the design of a layout as shown in FIGS. 3 through 6, and an output unit 703 for supplying the design results. The computing device 700 further includes the user interface by which a user enters instructions as input. The control unit 702 includes a controller or processor 706 (e.g., a CPU) for executing prescribed processes in accordance with programs, and a computer readable storage medium 707 for storing programs in the form of computer program code i.e., a set of executable instructions. The design method for designing an integrated circuit device is a software program comprising one or more sets of executable instructions stored within the computer readable storage medium 707 for execution by processor 706 according to one or more embodiments. In other embodiments, processor 706 is an application specific integrated circuit configured with one or more hardwired sets of instructions for execution. In some embodiments, the computer readable storage medium 707 is an electronic, magnetic, optical, electromagnetic, infrared, and/or a semiconductor system (or apparatus or device). For example, the computer readable storage medium 707 includes a semiconductor or solid-state memory, a magnetic tape, a removable computer diskette, a random access memory (RAM) a read-only memory (ROM), a rigid magnetic disk, and/or an optical disk. In some embodiments, using optical disks, the computer readable medium 707 includes a compact disk-read only memory (CD-ROM), a compact disk read/write (CD-R/W), and/or a digital video disc (DVD).

In one or more embodiments, the computing device 700 is a component within the LDE-aware module 20. In other embodiments, the LDE-aware module 20 and the LDE budgeting module 60 are software modules of a computing device such as computing device 700.

In accordance with one embodiment, a design system for designing an integrated circuit, and the design system includes a processor and a computer readable medium embodying computer program code. The computer program code includes instructions executable by the processor and configured to cause the processor to: modify a circuit design of the integrated circuit to compensate for an impact of layout parameters of the circuit design; generate at least one recommended layout parameter of an integrated circuit device within the integrated circuit; calculate a circuit performance parameter of the integrated circuit using the at least one recommended layout parameter; and generate a layout design of the modified circuit design of the integrated circuit according to the at least one recommended layout parameter.

In accordance with another embodiment, a design system for designing an integrated circuit, and the design system includes a processor and a computer readable medium embodying computer program code. The computer program code includes instructions executable by the processor and configured to cause the processor to: perform a simulation of a circuit design of the integrated circuit with predetermined layout parameters associated with a layout design, the layout design corresponding to the circuit design; generate a modified circuit design of the integrated circuit by modifying a circuit of the circuit design to compensate for an impact of the layout parameters according to the simulation; budget the layout parameters of an integrated circuit device of the modified circuit design based on design constraints of the integrated circuit and generate at least one recommended layout parameter based on the budgeting; and generate a second layout based on the modified circuit design and the at least one recommended layout parameter.

In accordance with another embodiment, A design system for designing an integrated circuit, and the design system includes a processor and a computer readable medium embodying computer program code. The computer program code includes instructions executable by the processor and configured to cause the processor to: perform a pre-layout simulation of a circuit design of the integrated circuit; generate a first layout according to a schematic of the circuit design based on the pre-layout simulation; perform a simulation of the circuit design with predetermined layout parameters; generate a modified circuit design of the integrated circuit by modifying a circuit of the circuit design to compensate for an impact of the layout parameters according to the simulation; budget the layout parameters for the modified circuit design based on design constraints of the integrated circuit and generate at least one recommended layout parameter based on the budgeting; generate a second layout based on the modified circuit design and the at least one recommended layout parameter; compare the at least one recommended layout parameter to the design constraints for violations; and perform a post-layout simulation of the modified circuit design based on the second layout.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A design system for designing an integrated circuit, comprising:
    a processor; and
    a computer readable medium embodying computer program code, the computer program code comprising instructions executable by the processor and configured to cause the processor to:
        generate a modified circuit design by modifying a circuit design of the integrated circuit to compensate for an impact of layout parameters of the circuit design;
        generate at least one recommended layout parameter of an integrated circuit device within the modified circuit design;
        calculate a circuit performance parameter of the modified circuit design using the at least one recommended layout parameter; and
        generate a layout design of the modified circuit design of the integrated circuit according to the at least one recommended layout parameter.

2. The design system of claim 1, further comprising:
a user interface configured to display at least one of the circuit performance parameter and layout constraints of the integrated circuit device of the integrated circuit.

3. The design system of claim 1, wherein the computer program code further comprises instructions executable by the processor and configured to cause the processor to:
    extract the layout parameters from a rough layout design of the circuit design and to calculate the impact of the layout parameters.

4. The design system of claim 1, wherein the computer program code further comprises instructions executable by the processor and configured to cause the processor to:
    back-annotate a schematic of the modified circuit design with the at least one recommended layout parameter.

5. The design system of claim 1, wherein the generating the at least one recommended layout parameter comprises causing the process to generate a set of layout constraints based on the circuit performance parameter.

6. The design system of claim 1, wherein the computer program code further comprises instructions executable by the processor and configured to cause the processor to:
    receive a set of design constraints via a user interface; and determine the at least one recommended layout parameter based on the set of design constraints.

7. The design system of claim 6, wherein the set of design constraints comprises an electrical constraint or an area constraint associated with the integrated circuit device.

8. The design system of claim 1, wherein the computer program code further comprises instructions executable by the processor and configured to cause the processor to:
 determine information including a cost function of the circuit, layout variables, and tolerance ranges of the integrated circuit device;
 modify the circuit performance parameter based on the information;
 receive sample points of the information and to evaluate the sample points and generate evaluation results; and
 generate the at least one recommended layout parameter based on the evaluation results.

9. The design system of claim 1, wherein the computer program code further comprises instructions executable by the processor and configured to cause the processor to:
 analyze and predict post-layout effects of the at least one recommended layout parameter.

10. The design system of claim 1, wherein the computer program code further comprises instructions executable by the processor and configured to cause the processor to:
 verify the at least one recommended layout parameter to determine whether violations of design constraints have occurred.

11. A design system for designing an integrated circuit, comprising:
 a processor; and
 a computer readable medium embodying computer program code, the computer program code comprising instructions executable by the processor and configured to cause the processor to:
  perform a simulation of a circuit design of the integrated circuit with predetermined layout parameters associated with a layout design, the layout design corresponding to the circuit design;
  generate a modified circuit design of the integrated circuit by modifying a circuit of the circuit design to compensate for an impact of the layout parameters according to the simulation;
  generate a set of layout constraints for the modified circuit design based on design constraints of the integrated circuit and generate at least one recommended layout parameter based on the set of layout constraints; and
  generate a second layout based on the modified circuit design and the at least one recommended layout parameter.

12. The design system of claim 11, wherein the computer program code further comprises instructions executable by the processor and configured to cause the processor to:
 compare the at least one recommended layout parameter with the design constraints for violations.

13. The design system of claim 11, wherein the computer program code further comprises instructions executable by the processor and configured to cause the processor to:
 perform a post-layout simulation of the modified circuit design based on the second layout.

14. The design system of claim 11, wherein the generating the set of layout constraints comprises causing the processor to:
 determine information including at least one of cost function of the circuit, layout variables, and tolerance ranges of the integrated circuit device;
 modify the predetermined layout parameters based on the information determined; and
 evaluate sample points of the information and generate evaluation results.

15. The design system of claim 14, wherein the generating the set of layout constraints comprises causing the processor to:
 back-annotate the predetermined layout parameters based on the evaluation results generated.

16. The design system of claim 11, wherein the computer program code further comprises instructions executable by the processor and configured to cause the processor to:
 calculate the circuit performance parameter of the integrated circuit device; and
 display the circuit performance parameter of the integrated circuit device on a user interface.

17. A design system for designing an integrated circuit, comprising:
 a processor; and
 a computer readable medium embodying computer program code, the computer program code comprising instructions executable by the processor and configured to cause the processor to:
  perform a pre-layout simulation of a circuit design of the integrated circuit;
  generate a first layout according to a schematic of the circuit design based on the pre-layout simulation;
  perform a simulation of the circuit design with predetermined layout parameters;
  generate a modified circuit design of the integrated circuit by modifying a circuit of the circuit design to compensate for an impact of the layout parameters according to the simulation;
  generate a set of layout constraints for the modified circuit design based on design constraints of the integrated circuit and generate at least one recommended layout parameter based on the set of layout constraints;
  generate a second layout based on the modified circuit design and the at least one recommended layout parameter;
  compare the at least one recommended layout parameter to the design constraints for violations; and
  perform a post-layout simulation of the modified circuit design based on the second layout.

18. The design system of claim 17, wherein the generating the set of layout constraints comprises causing the processor to:
 determine information including at least one of cost function of the circuit, layout variables, and tolerance ranges of an integrated circuit device;
 modify the predetermined layout parameters based on the information determined; and
 evaluate sample points of the information and generating evaluation results.

19. The design system of claim 18, wherein the generating the set of layout constraints comprises causing the processor to:
 back-annotate the predetermined layout parameters based on the evaluation results generated.

20. The design system of claim 17, wherein the computer program code further comprises instructions executable by the processor and configured to cause the processor to:
 perform a check of the at least one recommended layout parameter to determine whether the design constraints are violated.

* * * * *